United States Patent [19]

Kahn

[11] Patent Number: 5,137,776

[45] Date of Patent: Aug. 11, 1992

[54] METAL-COATED, ORDERED VOID PIEZOELECTRIC CERAMIC MATERIAL

[75] Inventor: Manfred Kahn, Alexandria, Va.

[73] Assignee: The United States of America as represented by the Secretary of the Navy, Washington, D.C.

[21] Appl. No.: 588,908

[22] Filed: Sep. 27, 1990

[51] Int. Cl.$^5$ .............................................. B32B 9/00
[52] U.S. Cl. .............................. 428/304.4; 428/306.6; 428/312.2; 428/316.6; 428/411.1; 428/426; 428/433; 428/457; 428/688; 428/195; 428/901
[58] Field of Search ............... 428/304.4, 306.6, 312.2, 428/316.6, 411.1, 195, 426, 433, 457, 688, 901

[56] References Cited

U.S. PATENT DOCUMENTS

| | | | |
|---|---|---|---|
| 2,640,165 | 5/1953 | Howatt | 310/8.1 |
| 3,052,949 | 9/1962 | Williams et al. | 29/25.35 |
| 3,879,645 | 4/1975 | Rutt et al. | 317/258 |
| 4,071,880 | 1/1978 | Rutt | 361/309 |
| 4,217,684 | 8/1980 | Brisken et al. | 29/25.35 |
| 4,227,111 | 10/1980 | Cross et al. | 310/358 |
| 4,333,065 | 6/1982 | DeVries | 310/313 C |
| 4,353,957 | 10/1982 | Rutt et al. | 428/292 |
| 4,613,784 | 9/1986 | Haun et al. | 310/358 |
| 4,683,161 | 7/1987 | Rice et al. | 428/178 |
| 4,928,264 | 5/1990 | Kahn | 310/337 |

Primary Examiner—Patrick J. Ryan
Attorney, Agent, or Firm—Thomas E. McDonnell; Barry A. Edelberg

[57] ABSTRACT

An ordered void piezoelectric ceramic material (e.g. lead zirconate titanate (PZT)) has its inner void surfaces coated with a thin flexible layer of a metal (e.g. silver) by a process which includes the following steps. First a quantity of an ordered void piezoelectric ceramic material is obtained. Next, the ordered void piezoelectric ceramic material is impregnated with a solution containing a metal, such that inner surfaces of the voids of the ceramic material are wetted with the impregnating solution. Then, excess impregnating solution is removed from the external edges of the piezoelectric ceramic material, leaving the inner surfaces of the voids wetted with impregnating solution. Then, the void-wetted piezoelectric ceramic material is fired to bring about formation of a thin flexible metal coating on the inner surfaces of the voids of the piezoelectric ceramic material.

21 Claims, 2 Drawing Sheets

METAL-COATED, ORDERED VOID PIEZOELECTRIC CERAMIC MATERIAL

BACKGROUND OF THE INVENTION

1. Field of the Invention

The invention described herein relates to the field of piezoelectric transducers. More specifically, the invention relates to ceramic piezoelectric transducers and especially to piezoelectric transducers employing lead zirconate titanate (PZT) ceramics.

2. Description of the Prior Art

Piezoelectric materials can be used both for (1) sensing sound and producing electrical signals representative of the sound and for (2) converting electrical signals into sound, whereby sound is projected or transmitted from the piezoelectric materials.

A particular type of ceramic material is here of special interest. This type of material has ordered voids with alternating planar ordered void regions and planar ordered solid regions. The solid regions between the voids are dense ceramic. One such ordered void ceramic material is an ordered void PZT ceramic material which is the subject of U.S. Pat. No. 4,683,161, incorporated herein by reference. This ordered void piezoelectric material is especially suitable for forming piezoelectric PZT high sensitivity acoustic sensors, usable as hydrophones in a high pressure underwater environment. The ordered void structure permits the PZT material to undergo a degree of compression in a direction at 90 degrees to the electrodes and thereby perform the piezoelectric sensing functions in a way that is significantly superior to what it would be without the voids. Nevertheless, the PZT ceramic having the ordered void structure does not perform very efficiently as an acoustic transmitter. This is so because the solid regions in between or under the voids are not subjected to the same electric field as the PZT material next to the voids when the material is poled or driven with an A. C. field. More specifically, the voids themselves are of low dielectric constant, and the solid regions of ceramic below and between the voids have a much higher dielectric constant. With an externally applied field, the low dielectric constant of the voids causes the electric fields in these voids to attain a relatively high value; and the electric field in the ceramic below and between the voids that are in series with these voids attains a very low value. The latter is then much lower than the field in the solid, void free ceramic columns next to the voids. The lack of uniform electric field distribution both impedes efficient poling of the PZT ceramic material and prevents uniform and low loss A. C. excitation. It would be desirable, therefore, to provide an ordered void PZT ceramic piezoelectric material that permits an applied electric field to more efficiently excite the solid regions in the PZT material that are in between or under the voids so that the piezoelectric material is more uniformly poled and can adequately serve as an acoustic transmitter.

There are composite ceramic materials disclosed in the prior art in which voids in the material are entirely filled with metal (e.g. solder). A representative patent disclosing such a composite material is U.S. Pat. No. 3,879,645 of Rutt et al which discloses monolithic ceramic capacitors that are formed by producing sintered ceramic bodies with voids. The voids are produced during sintering. The voids may have distinct pillars which remain after sintering. The voids are filled with a metal solder alloy to form conductive electrodes. The solder metal filling increases the compressive modulus of the ceramic voids, so that such a filled composite material exhibits decreased compressibility; and such decreased compressibility provides for a poor sensor.

SUMMARY OF THE INVENTION

Accordingly, it is an object of the present invention to provide a piezoelectric ceramic-air composite material that provides high efficiency for both sensing and projecting sound, especially underwater.

Another object of the present invention to provide a PZT ceramic composite that provides high efficiency for both sensing and projecting transmitted sound, especially underwater.

A further object of the invention is to provide a PZT ceramic material based on an ordered void structure that performs very efficiently as an acoustic transmitter in an underwater environment.

Another still further object of the invention is to provide a PZT ceramic material that contains ordered voids and undergoes uniform poling.

Yet another object of the invention is to provide an ordered void PZT ceramic piezoelectric material that permits variable electric fields to uniformly excite solid regions in the PZT material that are in between or under the voids along with the bulk of the PZT material in the void free columns so that the PZT serves adequately as an underwater acoustic transmitter.

Briefly, these and other objects are accomplished by formation of a novel composite material obtained by coating the inside surfaces of the voids of a piezoelectric ceramic-air composite, especially of an ordered void PZT material, with a thin metal coating. The thickness of the thin coating may be present in a range of 0.05 to 4 microns. The thin metal coating is inherently flexible, that is, more flexible than the ceramic material which is coated by the metal.

Preferably, the metal coating is applied by vacuum impregnating the voids in a piezoelectric ceramic material with a metal-containing material such as a metal-containing organometallic material. After impregnation, the void-containing piezoelectric ceramic is fired to provide a composite void-containing piezoelectric ceramic material having a thin metal-containing coating on the inside surfaces of the voids. The inside surfaces of the voids that are coated with metal include the top, side, and bottom surfaces of the voids. Preferably, the metal impregnant is a silver-containing material resulting in a silver coating on the inner surfaces of the voids of a preferred ordered void PZT ceramic material.

Although it is not desired to be bound by theory, it is believed that the presence of the thin metal coating on the inside walls of the voids of an ordered void PZT material serves to redistribute field gradients caused by an applied voltage, so that an acoustic signal is generated in the solid PZT regions that are both in between and under the voids. More specifically, the relatively high electric field that otherwise would occur in the low dielectric constant voids is shorted out by the conductive metal coating on the walls of the voids. This increases the field in the solid regions of the ceramic below and between the voids. In this way, a more uniform electric field is applied to the solid portions of the ordered void PZT ceramic material of the invention when it is poled or when A.C. driving signals are applied to the material. As a result, the PZT material of the invention provides a very efficient piezoelectric acoustic transducer for underwater applications, both for sensing and receiving functions.

The ordered void piezoelectric material is not porous within the ordinary meaning of that term. The ceramic between the voids is fully densified and, specifically, there are no interconnections between voids in different layers of the ceramic. Any interconnection between voids in different layers would fill with organometallic impregnant, and after sintering, a metal coating would be formed that would provide a short circuit between void layers. Such short circuits would reduce the efficiency of the ordered void piezoelectric material of the invention greatly.

Because it is necessary to avoid short circuits between different layers of the ordered voids, the outside edges of the workpiece that has been impregnated with metalloorganic should be cleaned of impregnant or residual metal. The edges can be cleaned by various conventional methods, such as wiping, etching, abrading, or by sawing or cutting the edges.

Other objects, advantages and novel features of the invention will become apparent from the following detailed description of the invention when considered in conjunction with the accompanying drawings herein.

DESCRIPTION OF THE PREFERRED EMBODIMENT(S)

Figure 1:
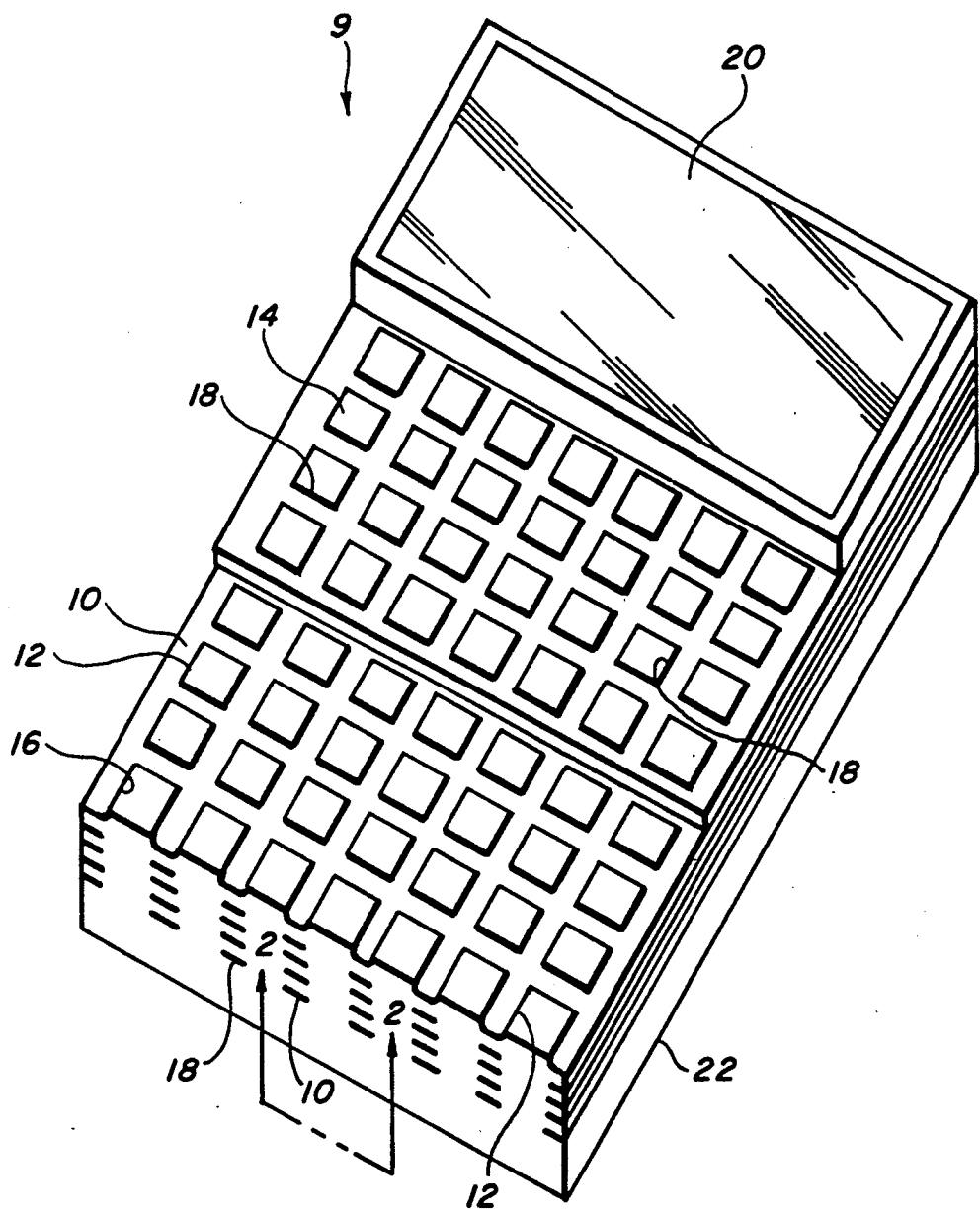
FIG. 1 is a diagram of a view of a piezoelectric sensor/transmitter comprised of an ordered void PZT material of the invention including a thin metal coating of silver metal on its inner surfaces.

With reference to FIG. 1, an ordered void PZT material 9 has hollow regions (voids) 10 which are defined by inner surfaces 12 in a matrix of the PZT material. The ordered void PZT material 9, which is poled in order to make the material piezoelectric, is similar to the ordered void PZT material described in greater detail with reference to FIG. 6 in U.S. Pat. No. 4,683,161, incorporated herein by reference.

A first electrode 20 and a second electrode 22 are present to provide a sensor/transmitter. A voltage is applied to the electrodes 20 and 22. The electrodes are preferably made of silver and can be applied to the external major surfaces of the ordered void piezoelectric material of the invention by using a silver-containing paste, by painting with a silver-containing paint, by screening, or by other conventional coating processes which may include a firing step. The thickness of the electrodes 20 and 22 can be in the range of 0.1 to 0.5 mil.

Briefly, the poling can be carried out by subjecting the ordered void PZT material to a DC electric field between electrodes 20 and 22 for a period of time an elevated temperature and then permitting the material to cool under the influence of the DC electric field. More specifically, the ordered void PZT material 9 shown in FIG. 1 herein is made by the following process. A ceramic in powdered form is suspended in an organic binder, and the combination is drawn into a tape (not shown). The tape is cut into segments. A layer of fugitive material, e.g. a material containing a large proportion of carbon, is then applied in a grid pattern to one surface of each segment. Then, the tape segments, containing the fugitive material pattern, are stacked.

The stack is formed so that the respective grid patterns of fugitive material in the stacked tape segments are indexed and placed in alignment, one above the other. Approximately 100–110 ceramic tape segments are stacked. Then, the stack is subjected to heat and pressure to form a composite laminate such as shown in FIG. 1. This is done below 150 degrees Centigrade, where also the solvent is evaporated from the stack of tape segments. At a temperature under 500 degrees Centigrade, the fugitive material is driven off. Then, the laminate is heated (sintered) to approximately 1280 degrees Centigrade to form a ceramic block having a grid pattern of internal voids.

The ceramic tape that is used is approximately 1.25 mil in thickness. The laminate formed from the stack of tape is approximately 110 mil thick before firing. After firing, the laminated stack is approximately 80 mil thick and has columnar regions containing voids alternating with columnar regions that do not contain voids (shown as void-free column 24 in FIG. 2.)

An alternative way to form a stack laminate is to form a stack containing alternating segments of plain ceramic tape and ceramic tape containing the applied grid pattern of fugitive material. The stack is formed so that the respective grid patterns of fugitive material in stacked tape segments are indexed and placed in alignment, one above the other. Approximately 100 ceramic tape segments are stacked (approximately 50–55 plain tape segments alternating with 50–55 patterned tape segments). Then, the stack is subjected to heat and pressure to form a composite laminate such as shown in FIG. 1. This laminate is then heated (sintered) to form a ceramic block having a grid pattern of internal voids.

As shown in FIG. 1, the voids 10 extend to the edge 16 of the ordered void PZT material 9. Thus, an impregnating liquid can penetrate into the voids in the interior of the material 9.

By preparing the ordered void piezoelectric material from alternating layers of ceramic tape that are coated with fugitive material with layers of uncoated ceramic tape, a composite material formed by subsequent metal-solution impregnation and firing has reduced potential interlayer shorting between voids in different layers.

Alternatively, if an ordered void PZT material were prepared in accordance with FIG. 6 in U.S. Pat. No. 4,683,161, then before impregnation with a metal-containing solution, the edges of the material would have to be trimmed off or abraded off to expose the voids to the edges of the ceramic material.

More specifically, the ordered void PZT matrix material 9 is, prior to impregnation, placed in a container (not shown) in a vacuum chamber (not shown) and is evacuated. Then a silver-containing organometallic solution is injected into the container while under vacuum. Then, the vacuum is stopped and air is permitted to enter the vacuum chamber. Any excess solution is then allowed to drain from the PZT material and wiped off of the edges of the material. The organometallic solution should have a low viscosity and a low surface tension to promote capillary action during impregnation.

Next, the impregnated PZT material is fired at a temperature sufficient to convert the organometallic liquid into a metallic coating typically from 580–700 degrees C. and perhaps as high as 850 degrees C. for approximately 5 minutes. After firing, the inner surfaces of the voids in the PZT material are coated with a thin coating of silver metal 18.

More specifically, a silver-containing organometallic solution (e.g. a commercially available solution of silver neodecanate containing approximately 17% silver and about 3% Bi in Bi-resinate form (as a binder) in an organic, toluene-containing solvent) is impregnated, using vacuum, into the voids of the PZT ceramic material. Any other organometallic solution having low viscosity and low surface tension which promote capillary action and penetration of the solution into the voids can also be used.

Although it is not desired to be bound by theory, the proposed theoretical explanation stated above is herein supplemented in order to lend greater understanding to the operation of the invention. This explanation will facilitated by reference to FIG. 2.

Figure 2:
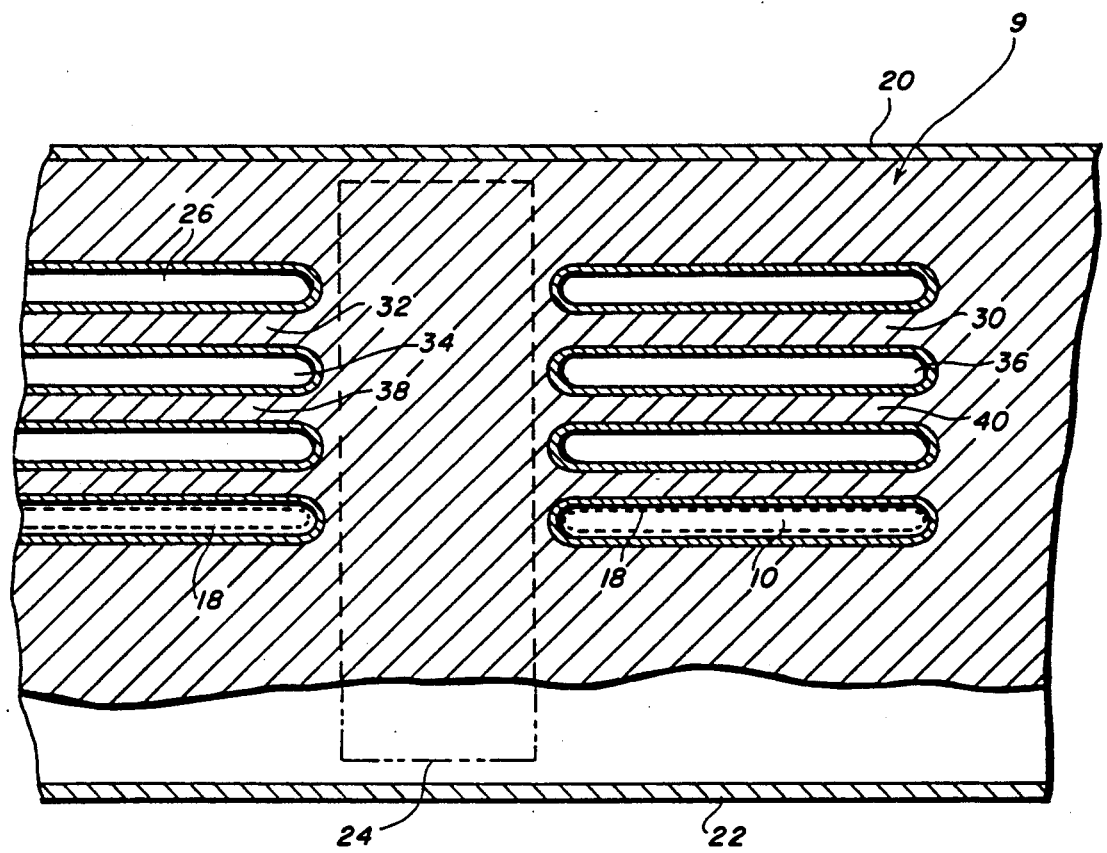
FIG. 2 is an enlarged cross-sectional view of a portion of the piezoelectric sensor/transmitter taken along the line 2—2 in FIG. 1.

With the invention, as shown in FIG. 2, which is an enlarged portion of a cross-section of FIG. 1, the ordered void piezoelectric material 9 of the invention is sandwiched between silver-based electrodes 20 and 22. A void-free column of PZT material is shown in the box 24. Voids 26 and 28 are in a first planar region. Dense, inter-void ceramic regions 30 and 32 are located in a second planar region that does not include any voids. Voids 34 and 36 are located in a third planar region, and intervoid ceramic regions 38 and 40 are located in a fourth planar region.

Generally, the voids are flat. Representative dimensions of structural elements in the ordered void piezoelectric material 9 of the invention are as follows. The transverse length of a void is approximately 30 mil. The vertical height of a void is approximately 1 mil. The vertical distance between adjacent voids is approximately 1 mil; that is the thickness of the ceramic regions 30, 32, 38, and 40 is approximately 1 mil. The distance between the sides of co-planar voids (e.g. voids 26 and 28) in the same horizontal planar region is in a range of approximately 30–70 mils. The vertical distance between the top electrode 20 and the topmost void 28 is approximately 4 mils. These dimensions are exemplary only. Ceramics according to the present invention having other dimensions are of course possible.

With the invention, thin coatings 10 of silver are coated on the inner surfaces of all the respective voids. With the invention, when a voltage is applied across the electrodes 20 and 22, the electric field non-uniformly distributes throughout the ordered void piezoelectric material 9 of the invention. The intensity of the electric field in the void-free column of PZT material in box 24 is less than the intensity of the electric field distributed in the inter-void ceramic regions 30, 32, 38, and 40 and the like. The presence of the silver coatings 10 and 18 on the inner surfaces of the voids 26, 28, 34, 36 and the like effectively shields the voids from electric field. Thus, substantially no electric field is present inside the respective voids. This leaves the electric field to distribute throughout the inter-void ceramic regions. Because a relatively strong electric field distributes across the inter-void ceramic regions with the invention, a sensor/transmitter using the ordered void piezoelectric material 9 of the invention is very sensitive as a sensor or transmitter.

In contrast, the operation of the ordered void piezoelectric material 9 of the invention is distinctly different from the ordered void piezoelectric material disclosed in U.S. Pat. No. 4,683,161 mentioned above. Without a metal coating 10 or the like on the inner surfaces of the voids, an applied electric field would distribute in a different non-uniform pattern through ordered void piezoelectric material. More specifically, a void-free column of PZT material would receive more of the electric field than inter-void regions when the inner surfaces of the voids are not coated with a metal. This is because the inter-void regions would receive substantially less electric field than the voids themselves. The voids contain air which has a lower dielectric constant than the ceramic material. Thus, a higher electric field will arise in the low dielectric constant voids than in the higher dielectric constant inter-void ceramic. Because more of electric field would, in essence, be wasted in the voids, with the prior art ordered void piezoelectric material, such material would be less effective in functioning as an acoustic transmitter.

Moreover, in respect to obtaining a uniform poling of the ceramic, a hydrostatic sensor/transmitter made from conventional ordered void piezoelectric PZT ceramic material, not metal-coated in accordance with the invention, has nearly unpolled solid regions in between the voids. This is so because the voids have a low dielectric constant causing a high field, and the solid material between the voids has a relatively high dielectric constant, greatly reducing the field in these regions. This lack of complete poling reduces the efficiency of a transmitter that is made from the poorly poled material. This poor performance also comes about because the high dielectric constant ceramic walls in between the voids are in large part shielded from the alternating electric field that is applied to the piezoelectric material when the ceramic is used as a transmitter, by the low dielectric constant voids. This further accounts for poor efficiency in this transmitter application However, with this invention, the metal coating on the inner surfaces of the voids of the PZT material serves to short circuit the undesirable electric fields in the voids themselves and permit electric fields to be applied across the previously shielded ceramic material matrix between the voids.

Furthermore, in an ordered void piezoelectric ceramic material, not having metal coating on the inner surfaces of the voids, the intensity of the poling field in the ceramic material between the voids is relatively low, and it is much lower than the intensity of the poling field in a void-free ceramic column. With uncoated inner void surfaces, there is then a great disparity between the degree of the poling between the two regions of the ceramic material. However, with the improvement of the invention, by coating the inner surfaces of the voids with a thin metal coating, the ceramic material between the voids is exposed to a greater intensisty of the poling field which is even greater than that in the void-free column of ceramic material. With the coated inner void surfaces of the invention, there is a relatively smaller disparity between the degree of the poling between the two regions of ceramic material because of the saturation of the degree of poling that sets in at higher poling fields.

The degree of poling that is experienced by a ceramic material depends upon additional considerations besides the intensity of the poling field. As the intensity of the poling field rises, the degree of poling experienced by the ceramic material approaches a limit due to saturation. The difference in the intensity of the poling field between the two ceramic regions in the prior art ordered void piezoelectric material prevents the two ceramic regions of interest from poling homogeneously.

In contrast, however, by employing the metal-coated, ordered void piezoelectric material of the invention, the ceramic material in planar regions between voids are exposed to fields nearer the saturation levels, whereby the poling of both regions of ceramic material are poled more homogeneously.

Another benefit obtained from the composite PZT ceramic material of the invention, which includes metal-coated inner surfaces of the PZT composite, is that the Poisson's ratio of the composite material is maintained at a low level; that is, the compressibility of the composite material is not appreciably reduced by the presence of the metal coating on the inner surfaces of the PZT ceramic material. The metal coating is thin and by virtue of its thinness is flexible, that is, much more flexible than the ceramic material which it coats. Accordingly, the electric field is modified, as described above, without affecting the mechanical stress distribution significantly.

Although the embodiments of the invention described thus far provide a silver coating on the inner surfaces of the voids of ordered void ceramic material, other conductive metals can be used. For example, copper, nickel, gold, palladium, and platinum impregnants, and mixtures thereof, and resultant coatings can also be employed.

Other organometallic materials suitable for impregnating the ordered void ceramic material include the following materials: silver 2-ethyl hexandate, gold 2-ethyl hexandate, or gold neodecanate.

Although the ordered void ceramic material described above is an ordered void PZT ceramic material, other ordered void ceramic materials capable of being poled to become piezoelectric, such as the piezoelectric titanates, niobates, or tantalates, can also be employed. For example, ordered void ceramic materials can be made piezoelectric from the following materials and can also have the inner walls of the voids coated with a thin metal coating in accordance with the principles of the invention: barium titanate, lead titanate, and lead lanthanum titanate.

Numerous benefits are obtained by following the principles of the invention. With the invention, a hydrostatic sensor can be fabricated that has high sensitivity and can also be used as an efficient sound projecting device.

It will be understood that various changes in the details, steps and arrangement of parts which have been herein described and illustrated to explain the nature of the invention, may be made by those skilled in the art within the principles and scope of the invention as expressed in the appended claims.

What is claimed is:

1. A piezoelectric ceramic material, comprising: an ordered void piezoelectric ceramic material, and a thin coating of an electrically conductive metal, having a thickness of 0.05–4 microns, deposited on inner surfaces of the voids of said ordered void piezoelectric ceramic material and not filling the voids.

2. The material described in claim 1 wherein said metal coating includes silver metal.

3. A method for producing a composite ordered void piezoelectric ceramic material, comprising the steps of:
   obtaining a quantity of ordered void piezoelectric ceramic material,
   impregnating the ordered void piezoelectric ceramic material with an organometallic solution containing an electrically conductive metal, said impregnating solution having a viscosity and surface tension sufficiently low that said impregnation wets inner surfaces of voids of the ceramic material with the impregnating solution,
   removing excess impregnating solution from the outside of the ceramic material leaving the inner surfaces of the voids wetted with impregnating solution, and
   firing the wetted ceramic material to bring about formation of an electrically conductive, thin metal coating on the inner surfaces of the voids of the ceramic material.

4. The method described in claim 3 wherein the impregnating solution contains a form of silver.

5. The method described in claim 3 wherein the impregnating solution contains an organometallic form of silver.

6. The method described in claim 3 wherein the ordered void piezoelectric ceramic material is fired at a temperature in the range of 500–850 degrees Centigrade.

7. An ordered void piezoelectric ceramic material obtained by a process including the steps of:
   obtaining a quantity of ordered void piezoelectric ceramic material,
   impregnating the ordered void piezoelectric ceramic material with an organometallic solution containing an electrically conductive metal, said impregnating solution having a viscosity and surface tension sufficiently low that said impregnation wets inner surfaces of voids of the ceramic material with the impregnating solution,
   removing excess impregnating solution from the external edges of the ordered void piezoelectric ceramic material leaving the inner surfaces of the ordered void piezoelectric ceramic material wetted with impregnating solution, and
   firing the wetted ordered void piezoelectric ceramic material to bring about formation of an electrically conductive thin metal coating, having a thickness of 0.05–4 microns, on the inner surfaces of the ordered void piezoelectric ceramic material.

8. A lead zirconate titanate (PZT) piezoelectric ceramic material, comprising:
   an ordered void lead zirconate titanate (PZT) ceramic material, and
   a thin coating of an electrically conductive metal, having of thickness of 0.05–4 microns, deposited on inner surfaces of the PZT material.

9. The material described in claim 8 wherein said metal coating includes a metal selected from the group consisting of silver, gold, platinum, copper, nickel, and palladium and mixtures thereof.

10. A method for producing a composite lead zirconate titanate (PZT) ceramic material, comprising the steps of:
   obtaining a quantity of ordered void PZT material,
   impregnating the ordered void PZT material with an organometallic solution containing an electrically conductive metal, said impregnating solution having a viscosity and surface tension sufficiently low that said impregnation wets inner surfaces of the voids of the PZT material with the impregnating solution,
   removing excess impregnating solution from the external edges of the PZT material leaving the inner surfaces of the ordered void PZT material wetted with impregnating solution, and firing the PZT material to bring about formation of an electrically conductive metal coating, having a thickness of 0.05–4 microns, on the inner surfaces of the ordered void PZT material.

11. The method described in claim 10 wherein the impregnating solution contains a form of silver.

12. The method described in claim 10 wherein the PZT material is fired at a temperature in the range of 500–850 degrees Centigrade.

13. A lead zirconate titanate (PZT) piezoelectric ceramic material obtained by a process including the steps of:
    obtaining a quantity of ordered void PZT material,
    impregnating the ordered void PZT material with an organometallic solution containing an electrically conductive metal, said impregnating solution having a viscosity and surface tension sufficiently low that said impregnation wets inner surfaces of the voids of the PZT material with the impregnating solution,
    removing excess impregnating solution from the PZT material leaving the inner surfaces of the ordered void PZT material wetted with impregnating solution, and
    firing the PZT material to bring about formation of an electrically conductive metal coating, having a thickness of 0.05–4 microns, on the inner surfaces of the ordered void PZT material.

14. A piezoelectric sensor/transmitter, comprising:
    a first electrode,
    a quantity of an ordered void piezoelectric ceramic material in contact with said first electrode,
    a thin coating of an electrically conductive metal, having a thickness of 0.05–4 microns, deposited on inner surfaces of the voids of said ordered void piezoelectric ceramic material and not filling the voids, and
    a second electrode contacting said quantity of ordered void piezoelectric material, said ordered void piezoelectric material located between said first and second electrodes.

15. The material of claim 1, wherein said metal coating includes a metal selected from the group consisting of silver, gold, platinum, copper, nickel, and palladium and mixtures thereof.

16. The method of claim 3, wherein said electrically conductive metal includes a metal selected from the group consisting of silver, gold, platinum, copper, nickel, and palladium and mixtures thereof.

17. The material of claim 7, wherein said metal coating includes a metal selected from the group consisting of silver, gold, platinum, copper, nickel, and palladium and mixtures thereof.

18. The material of claim 8, wherein said metal coating includes a metal selected from the group consisting of silver, gold, platinum, copper, nickel, and palladium and mixtures thereof.

19. The method of claim 10, wherein said electrically conductive metal includes a metal selected from the group consisting of silver, gold, platinum, copper, nickel, and palladium and mixtures thereof.

20. The material of claim 13, wherein said metal coating includes a metal selected from the group consisting of silver, gold, platinum, copper, nickel, and palladium and mixtures thereof.

21. The sensor/transmitter of claim 14, wherein said metal coating includes a metal selected from the group consisting of silver, gold, platinum, copper, nickel, and palladium and mixtures thereof.

* * * * *